(12) United States Patent  
Koyama et al.

(10) Patent No.: US 7,501,696 B2  
(45) Date of Patent: Mar. 10, 2009

(54) SEMICONDUCTOR CHIP-EMBEDDED SUBSTRATE AND METHOD OF MANUFACTURING SAME

(75) Inventors: Tetsuya Koyama, Nagano (JP); Tsuyoshi Kobayashi, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 486 days.

(21) Appl. No.: 11/188,322

(22) Filed: Jul. 25, 2005

(65) Prior Publication Data

US 2006/0022332 A1    Feb. 2, 2006

(30) Foreign Application Priority Data

Jul. 30, 2004    (JP) .............................. 2004-223293

(51) Int. Cl.  
*H01L 21/70* (2006.01)  
*H01L 23/12* (2006.01)

(52) U.S. Cl. .................. 257/686; 438/109; 438/126; 257/787; 257/23.003 E; 257/E21.499; 257/E21.502

(58) Field of Classification Search ................ 257/296, 257/723, 686, 787, E23.003, E21.499, E21.502, 257/E21.505; 438/109, 126

See application file for complete search history.

(56) References Cited

U.S. PATENT DOCUMENTS

| | | | |
|---|---|---|---|
| 5,689,135 A * | 11/1997 | Ball ............................ 257/676 |
| 6,287,892 B1 * | 9/2001 | Takahashi et al. ........... 438/107 |
| 6,642,081 B1 * | 11/2003 | Patti ........................... 438/109 |
| 6,696,320 B2 * | 2/2004 | Gacusan ...................... 438/109 |
| 6,753,207 B2 * | 6/2004 | Hur .............................. 438/109 |
| 6,759,268 B2 * | 7/2004 | Akagawa ..................... 438/106 |
| 6,905,912 B2 * | 6/2005 | Maeda et al. ................ 438/108 |
| 6,933,172 B2 * | 8/2005 | Tomimatsu ................. 438/109 |
| 6,939,738 B2 * | 9/2005 | Nakatani et al. ............ 438/108 |
| 6,949,818 B2 * | 9/2005 | Park ............................ 257/686 |
| 6,960,826 B2 * | 11/2005 | Ho et al. ..................... 257/723 |
| 6,964,887 B2 * | 11/2005 | Akagawa ..................... 438/126 |
| 7,008,820 B2 * | 3/2006 | Shim et al. .................. 438/108 |
| 7,064,003 B2 * | 6/2006 | Wallace ....................... 438/106 |
| 7,129,113 B1 * | 10/2006 | Lin et al. ..................... 438/109 |
| 7,132,311 B2 * | 11/2006 | Akiba et al. ................. 438/109 |
| 7,235,870 B2 * | 6/2007 | Punzalan et al. ............ 257/685 |
| 7,262,080 B2 * | 8/2007 | Go et al. ..................... 438/109 |
| 7,262,081 B2 * | 8/2007 | Yang et al. .................. 438/109 |
| 7,262,082 B1 * | 8/2007 | Lin et al. ..................... 438/109 |
| 7,265,441 B2 * | 9/2007 | Reiss et al. .................. 257/685 |
| 7,279,361 B2 * | 10/2007 | Karnezos ..................... 438/109 |
| 7,327,021 B2 * | 2/2008 | Satou et al. .................. 257/686 |
| 7,352,057 B2 * | 4/2008 | Grafe et al. .................. 257/686 |

(Continued)

FOREIGN PATENT DOCUMENTS

| JP | 2001-15650 A | 1/2001 |
|---|---|---|
| JP | 2001-217381 A | 8/2001 |
| JP | 2001-332643 A | 11/2001 |

(Continued)

*Primary Examiner*—M. Wilczewski  
(74) *Attorney, Agent, or Firm*—Paul & Paul

(57) ABSTRACT

A semiconductor chip-embedded substrate comprising a supporting substrate and an insulating layer thereon, members for the connection to external circuits, and a plurality of semiconductor chips embedded in the insulating layer, wherein at least some of the plurality of semiconductor chips are embedded as a stack or stacks thereof. A method of manufacturing such a semiconductor chip-embedded substrate is also disclosed.

15 Claims, 5 Drawing Sheets

U.S. PATENT DOCUMENTS

| | | | |
|---|---|---|---|
| 7,354,798 B2 * | 4/2008 | Pogge et al. | 438/109 |
| 7,364,945 B2 * | 4/2008 | Shim et al. | 438/109 |
| 7,385,283 B2 * | 6/2008 | Wu et al. | 257/686 |
| 2001/0054758 A1 * | 12/2001 | Isaak | 257/686 |
| 2002/0005577 A1 * | 1/2002 | Shimoda | 257/723 |
| 2002/0022300 A1 * | 2/2002 | Shin | 438/109 |
| 2003/0137042 A1 * | 7/2003 | Mess et al. | 257/686 |
| 2003/0162326 A1 * | 8/2003 | Tsubosaki et al. | 438/109 |
| 2004/0012081 A1 * | 1/2004 | Kwon | 257/678 |

FOREIGN PATENT DOCUMENTS

| | | |
|---|---|---|
| JP | 2002-9236 A | 1/2002 |
| JP | 2002-170827 A | 6/2002 |
| JP | 2003-318323 A | 11/2003 |

* cited by examiner

SEMICONDUCTOR CHIP-EMBEDDED SUBSTRATE AND METHOD OF MANUFACTURING SAME

BACKGROUND OF THE INVENTION

1. Field of the Invention

The present invention relates to a semiconductor chip-embedded substrate, and to a method of manufacturing same.

2. Description of Related Art

Conventionally, in manufacturing a packaged substrate, for example, semiconductor chips are mounted on a substrate. In mounting chips, a single chip may be mounted, or plural chips may be mounted to form a package. In any event, however, no attempt has been made to embed chips into a substrate.

In recent years, as the performance of electronic apparatus using semiconductor devices such as semiconductor chips has become higher and more elaborate, it is increasingly required to improve the packaging density of semiconductor chips and to reduce the size and footprint of a substrate having semiconductor chips mounted thereon. In order to meet these requirements, various substrates having semiconductor chips embedded, so-called chip-embedded substrate or semiconductor device, has been proposed.

In JP 2001-332643 A, for example, a semiconductor device is disclosed which is obtained by disposing a plurality of semiconductor chips on a dicing frame, forming a patterned resin film (protective film), and, after rerouting lines, posts (pillar-like protrusions) and a second protective film are formed, performing dicing to form a multi-chip module.

In JP 2003-318323 A, a semiconductor device is described which is manufactured by adhering a plurality of semiconductor chips to a base plate and, after an insulating layer, a rerouting layer, protruded electrodes and solder balls are successively formed, removing the base plate and cutting the insulating layer between the chips.

In JP 2001-217381 A, a packaged semiconductor device is described where a plurality of semiconductor chips are placed on a mounting jig, copper posts are formed on each semiconductor chip and, after the chips are sealed with sealing resin, a rerouting layer with lands is formed, copper posts are formed on the lands and rerouting layer is sealed with sealing resin, a solder ball is formed on the exposed copper post.

In JP 2002-170827 A, a technology for manufacturing a printed wiring board is described in which semiconductor chips having a transition layer located on a die pad are placed in concavities provided in a core substrate.

In JP 2001-15650 A, a method for manufacturing a ball grid array (BGA) package is described where an IC chip is joined to a metal heat sink, a plurality of insulating resin layers are formed to cover the IC chip and mounting pads of the IC chip are connected to BGA mounting pads formed on the surface of the uppermost insulating resin layer.

In JP 2002-9236 A, a multilayer semiconductor device and a method of manufacturing same is disclosed in which a circuit board is constituted by arranging a film type semiconductor package having a semiconductor chip embedded to a package-accommodating hole of a wiring layer and a multilayer semiconductor device is formed by stacking plural circuit boards and electrically interconnecting the wirings of respective circuit boards.

As described above, various chip-embedded substrates and manufacturing method thereof have been proposed in order to meet requirements such as high density packaging of semiconductor chips on a substrate, miniaturization and space-saving of substrates having semiconductor chips mounted thereon, and the like. However, in order to meet these requirements, which will certainly increase in future, the development of chip-embedded substrates with higher packaging density of chips, which affords further miniaturization and higher reliability, is indispensable. To date, no satisfactory chip-embedded substrate has been known.

SUMMARY OF THE INVENTION

It is an object of the present invention to provide a semiconductor chip-embedded substrate which embeds semiconductor chips at higher density than has ever been possible, and which affords further miniaturization and higher reliability, and to a method of manufacturing same.

A semiconductor chip-embedded substrate according to the present invention comprises a supporting substrate and an insulating layer thereon, members for connection to external circuits, and a plurality of semiconductor chips embedded in the insulating layer, wherein at least some of the plurality of semiconductor chips are embedded as a stack or stacks.

The stack or stacks of semiconductor chips may be disposed only on one side of the supporting substrate, or may be disposed on both sides of the supporting substrate.

The semiconductor chips constituting the stack may be electrically connected to each other by wire bonding, or may be electrically connected using through-holes provided at least in one of the chips. Upper and lower semiconductor chips constituting a stack may also be electrically connected to each other via a electro-conductive material, such as solder or gold, interposed therebetween.

The semiconductor chip-embedded substrate of the present invention can be manufactured using a method comprising the steps of: disposing a plurality of semiconductor chips on a supporting substrate, forming an insulating layer so as to cover these semiconductor chips, and forming members for the connection to external circuits, wherein at least some of the plurality of semiconductor chips are provided as a stack formed by stacking them, and the stack is disposed on the substrate.

The stack or stacks of semiconductor chips may be disposed only on one side of the supporting substrate, or may be disposed on both sides of the supporting substrate.

The stack of semiconductor chips may be formed by electrically connecting upper and lower semiconductor chips by wire-bonding them, or utilizing through holes provided at least one of the chips. The laminate may be formed by electrically connecting upper and lower semiconductor chips by an electro-conductive material interposed therebetween.

According to the present invention, by using semiconductor chips which have been stacked in advance, it is possible to provide a thin or miniature semiconductor chip-embedded substrate having semiconductor chips embedded therein in high density. The stack of semiconductor chips can be free from a lowering of positioning accuracy due to differences in coefficient of expansion, and can improve the precision of the semiconductor chip-embedded substrate and, accordingly, thereby enhance its reliability. Further, if the stacks of semiconductor chips are disposed symmetrically on both sides of the supporting substrate, it is possible to provide a semiconductor chip-embedded substrate with no or reduced warping due to differences in coefficients of expansion in different materials. According to the present invention, by using, for example, a stack of chips of 100 μm or less in thickness, it is possible to produce a chip-embedded substrate of 500 μm or less in thickness.

DETAILED DESCRIPTION OF THE INVENTION

Various embodiments of the present invention will be described below with reference to the drawings. It is to be understood that the present invention is by no means limited to these embodiments.

A stack of semiconductor chips is utilized in the semiconductor chip-embedded substrate of the present invention.

Figure 1A:
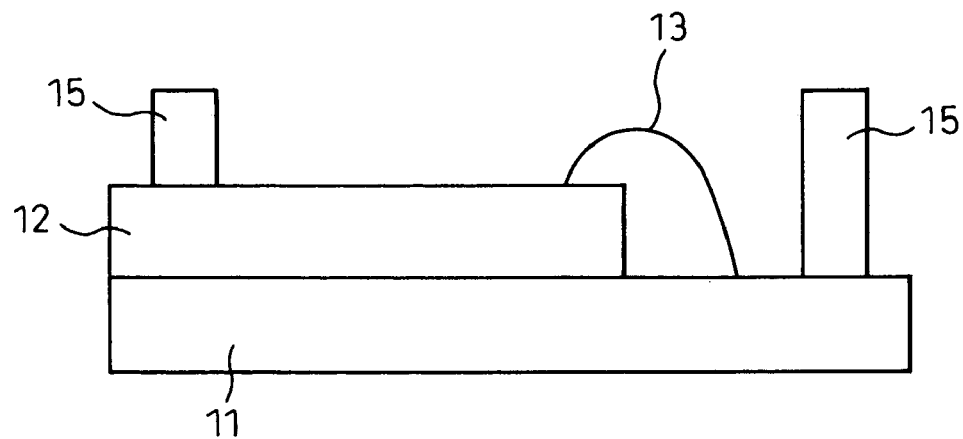
FIGS. 1A to 1C are views illustrating examples of stacks of semiconductor chips used in the present invention.
Figure 1B:
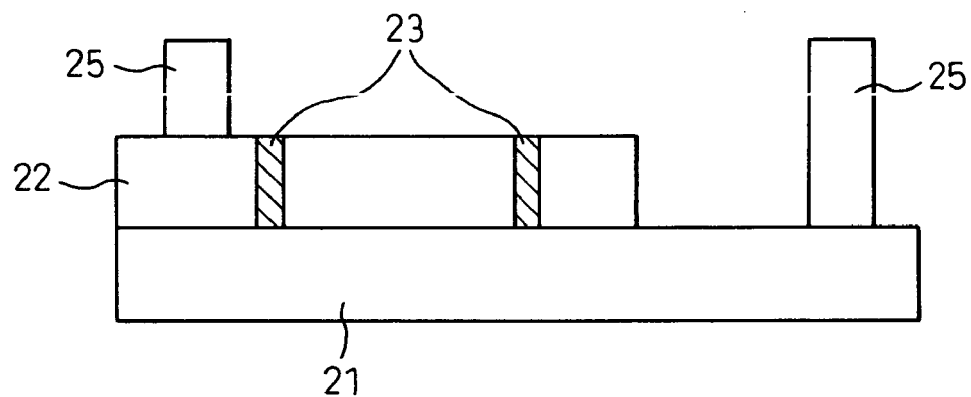
Figure 1C:
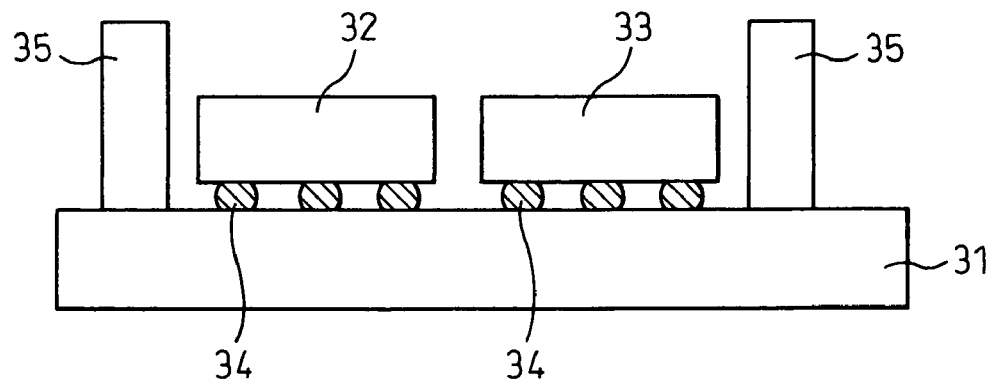

FIGS. 1A to 1C show examples of stacks of semiconductor chips conveniently used in the chip-embedded substrate of the present invention.

A stack shown in FIG. 1A is made by stacking two chips 11, 12 in a face-up fashion with electrical connection between the chips being done by wire bonding using wire 13. The connection between chips can be accomplished, for example, by a method in which a die attach tape (not shown) adhered to the rear surface of the upper chip 12 is used, and the chip 12 is disposed on the chip 11 to achieve connection of the two. On each of the chips 11, 12, a post 15 is formed for the connection to an external circuit. Another chip can also be superimposed on the upper chip 12 shown in the drawing.

A stack shown in FIG. 1B is also made by stacking two chips 21, 22 in a face-up fashion with electrical connection between the chips being done using through-holes 23 provided in the upper chip 22. Two chips 21, 22 can be electrically connected to each other by solder filled into the through-holes 23 to a pad (not shown) formed of, for example, aluminum on the upper surface of the lower chip 21 in the position corresponding to the through-holes 23. On each of the chips 21, 22, a post 25 is also formed for the connection to an external circuit. Another chip can also be superimposed on the upper chip 22.

A stack shown in FIG. 1C is fabricated in a face-down fashion, with chips 32, 33 being superimposed on a chip 31. Connection between the upper chips 32, 33 and the lower chip 31 can be done using bumps 34 formed of electro-conductive material such as solder or gold. Posts 35 are formed on the chip 31 for connecting the stack to an external circuit.

The posts 15, 25, 35 provided in the stacks illustrated in FIGS. 1A to 1C can be formed, for example, by forming, after stacking the chips, a seed layer of copper by sputtering on one surface of the stack, forming a resist pattern having openings in the portions at which the posts are to be formed, filling copper in the opening by electrolytic copper plating using the seed layer as a current feeding layer, planarizing the resist layer together with the copper in the openings, and then removing the resist layer and the underlying seed layer. The material for posts 15, 25, 35 is not limited to copper, and the method for forming posts is not limited to the method described above.

The chips in the stack used in the present invention are not limited to simple semiconductor chips, but chip scale packages (CSPs) or wafer level packages (WLPs) fabricated using such chips may also be used.

The chip-embedded substrate of the present invention can be manufactured using a stack of chips, as illustrated above, as follows.

Figure 2A:
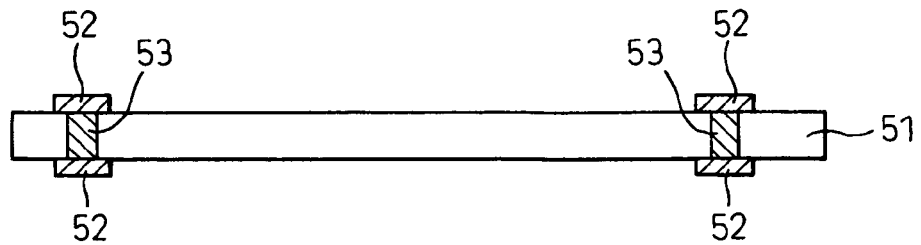
FIGS. 2A to 2I are views illustrating a method for manufacturing a semiconductor chip-embedded substrate according to the present invention.

As shown in FIG. 2A, a supporting substrate (core substrate) 51 for mounting a stack of chips thereon is provided. The supporting substrate 51 is formed of an insulating material (such as a resin), and is provided with connection pads 52 on both sides and through-holes 53 for the connection thereof.

Figure 2B:
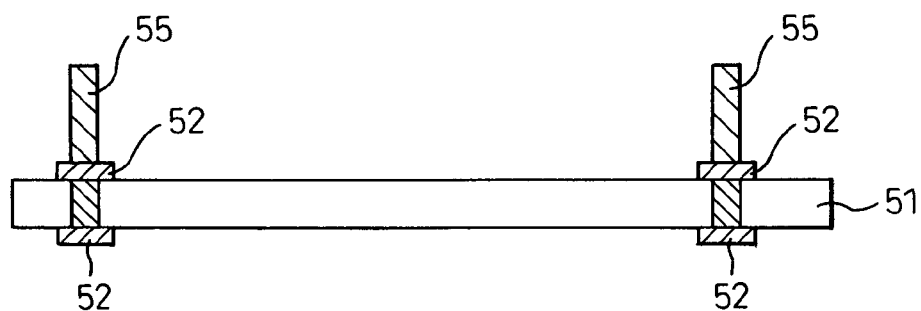
Figure 2C:
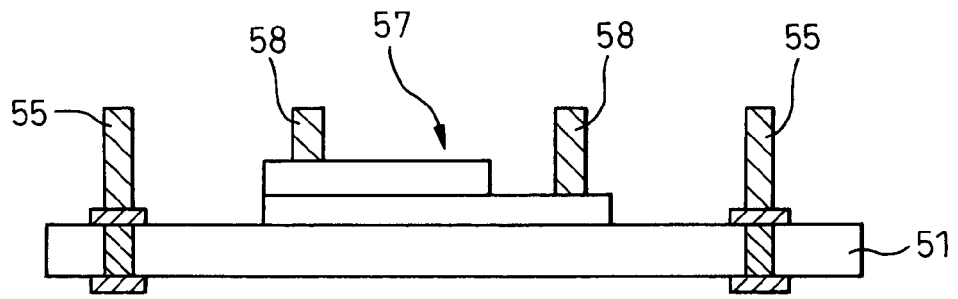

As shown in FIG. 2B, posts 55 of an electro-conductive material, such as copper, (members for forming vias penetrating the completed semiconductor chip-embedded substrate) are formed on the pads 52 located on the upper face of the supporting substrate 51 by any method known in the field of manufacture of semiconductor devices. Then, as shown in FIG. 2C, a stack 57 of chips having been formed in advance is joined to the upper surface of the supporting substrate 51. A die attach tape (not shown) adhered to the rear surface (the surface having no post 58 formed thereon) of the chip stack 57 can be used for the joining.

Figure 2D:
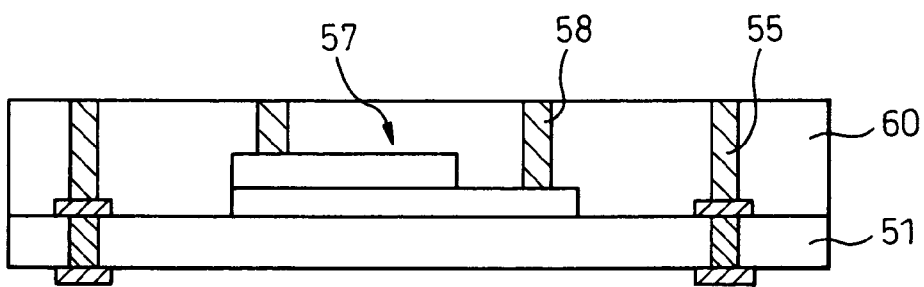

Then, as shown in FIG. 2D, an insulating layer (dielectric layer) 60 is formed all over the upper surface of the supporting substrate 51 so as to cover the chip laminate 57. A tape of a prepreg material, for example, can be used to form the insulating layer 60. Processing, such as planarization, may be performed on the insulating layer 60 to expose the tops of the posts 55, 58 on the surface of the insulating layer 60.

Figure 2E:
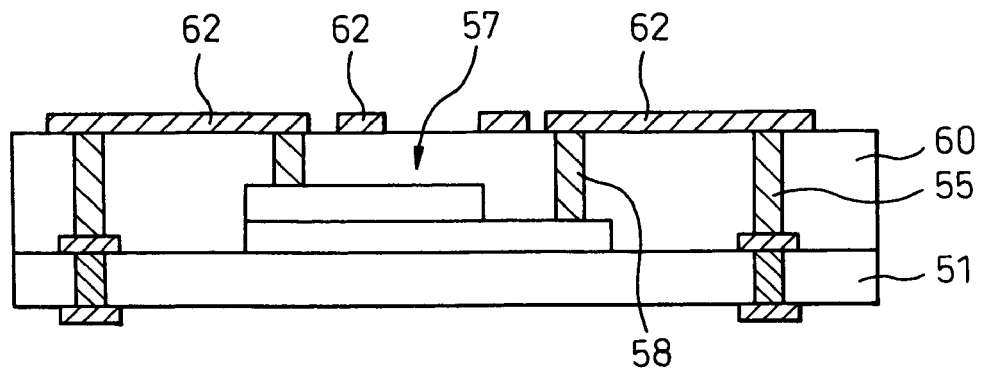
Figure 2F:
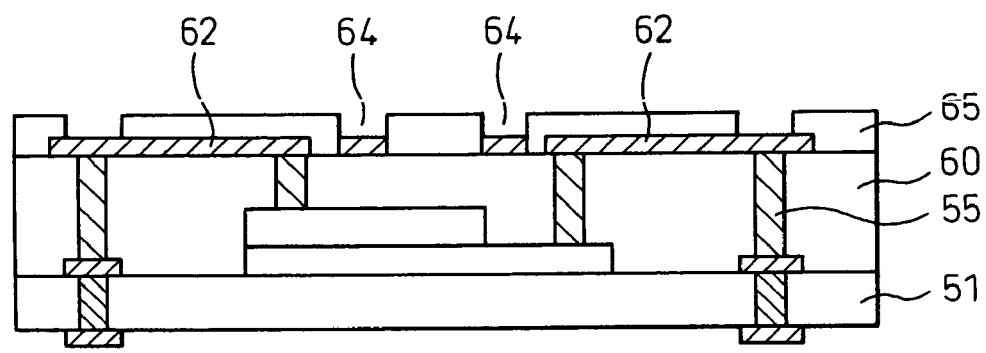
Figure 2G:
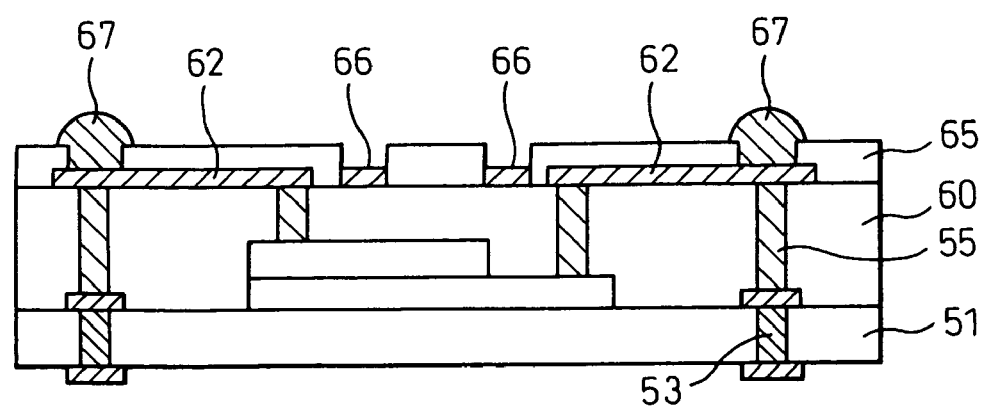

On the insulating layer 60, a wiring layer 62 is formed, as shown in FIG. 2E. Then, as shown in FIG. 2F, a solder resist layer 65 with openings 64 to expose parts of the wiring layer 62 is formed. On the exposed wiring layer 62, an Ni/Au plating layer (not shown) is formed to thereby form pads 66 for mounting another semiconductor chip (not shown), and solder bumps 67 connected to the posts 55 penetrating the insulating layer 60 and connected to the through-holes 53 of the supporting substrate 51 are formed, as shown in FIG. 2G.

Figure 2H:
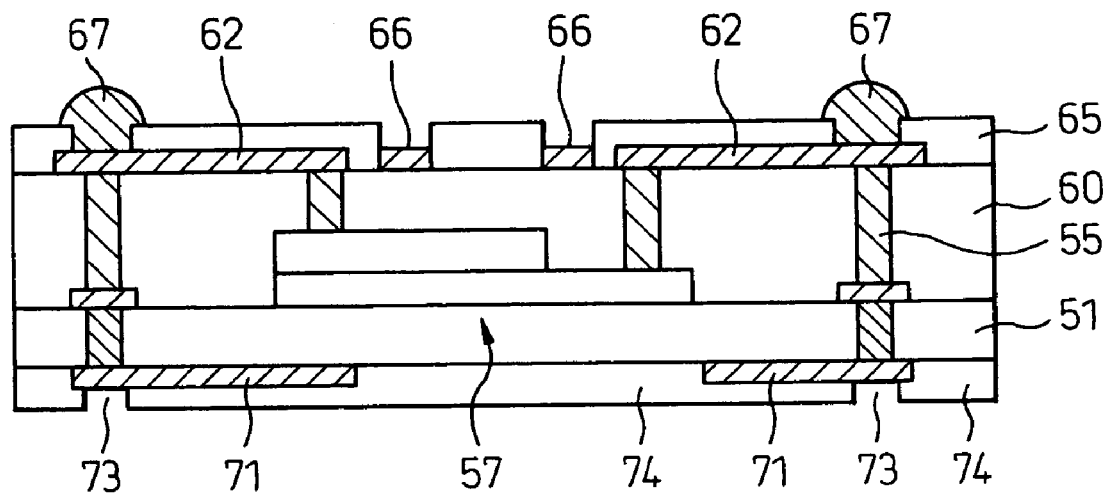
Figure 2I:
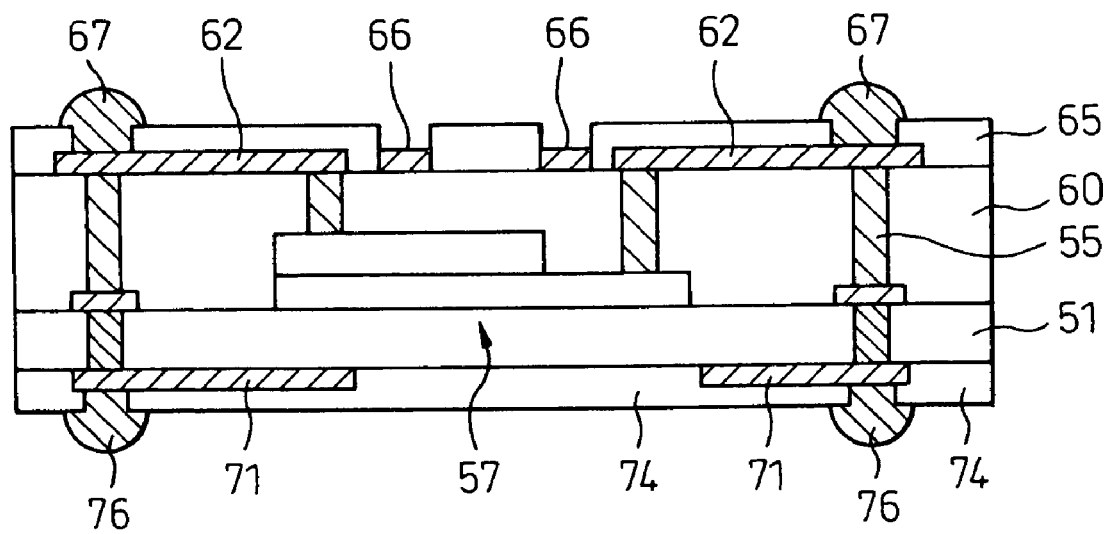

Then, as shown in FIG. 2H, a wiring layer 71 connecting to the pads 52 (FIG. 2A) is formed on the rear surface of the supporting substrate 51, and a solder resist layer 74 with openings 73 to expose parts of the wiring layer 71 is formed. After an Ni/Au plating layer (not shown) is formed on the exposed wiring layer 71, solder bumps 76 connection to the wiring layer 71 are formed, as shown in FIG. 2I.

The semiconductor chip-embedded substrate (FIG. 2I) according to the present invention thus manufactured has a stack 57 of semiconductor chips embedded in the insulating layer 60 formed on one surface of the supporting substrate 51. This semiconductor chip-embedded substrate can use the pads 66 provided on its upper surface to mount thereon another semiconductor chip (not shown) or the like, and also can use the solder bumps 76 provided on its lower surface and be mounted on still another substrate. The pads 66 on the upper surface may be omitted if the another semiconductor chip need not be mounted. Although not shown, this semiconductor chip-embedded substrate can contain a single chip or chips, in addition to the stack 57 of semiconductor chips. It can also contain stacks of semiconductor chips which are different in the number of the stacked semiconductor chips.

Figure 3:
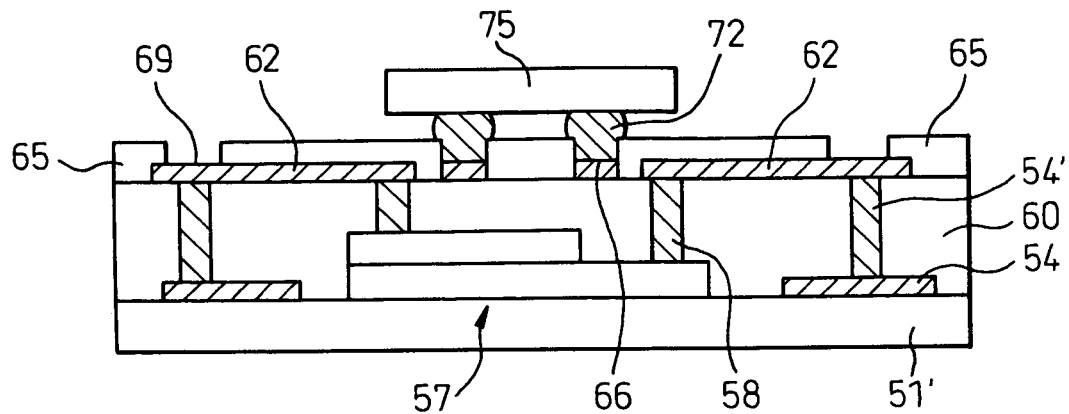
FIG. 3 is a view illustrating another embodiment of the semiconductor chip-embedded substrate according to the present invention.

The semiconductor chip-embedded substrate of the present invention may have members for connection to an external circuit provided only on one surface thereof. The semiconductor chip-embedded substrate of this embodiment, as shown in FIG. 3, can be manufactured using a supporting substrate 51' provided on one surface with a wiring layer 54 and posts 54' connected thereto in place of the supporting substrate 51 provided with the connection pads 52 on both surfaces and through-holes 53 connected thereto as described above with reference to FIG. 2A, and using a method analogous to the method as described above with reference to FIGS. 2A to 2G. In FIG. 3, the same members, as shown in FIGS. 2A to 2G, are denoted by same reference numerals and symbols.

In the semiconductor chip-embedded substrate shown in FIG. 3, another semiconductor chip 75 having bumps 72 can be mounted through the pads 66 formed of an Ni/Au plating layer (not shown) provided on the wiring layer 62. Similarly, the pad 69 formed of an Ni/Au plating layer (not shown) provided on the wiring layer 62 can be used for connection to an external circuit.

Figure 4:
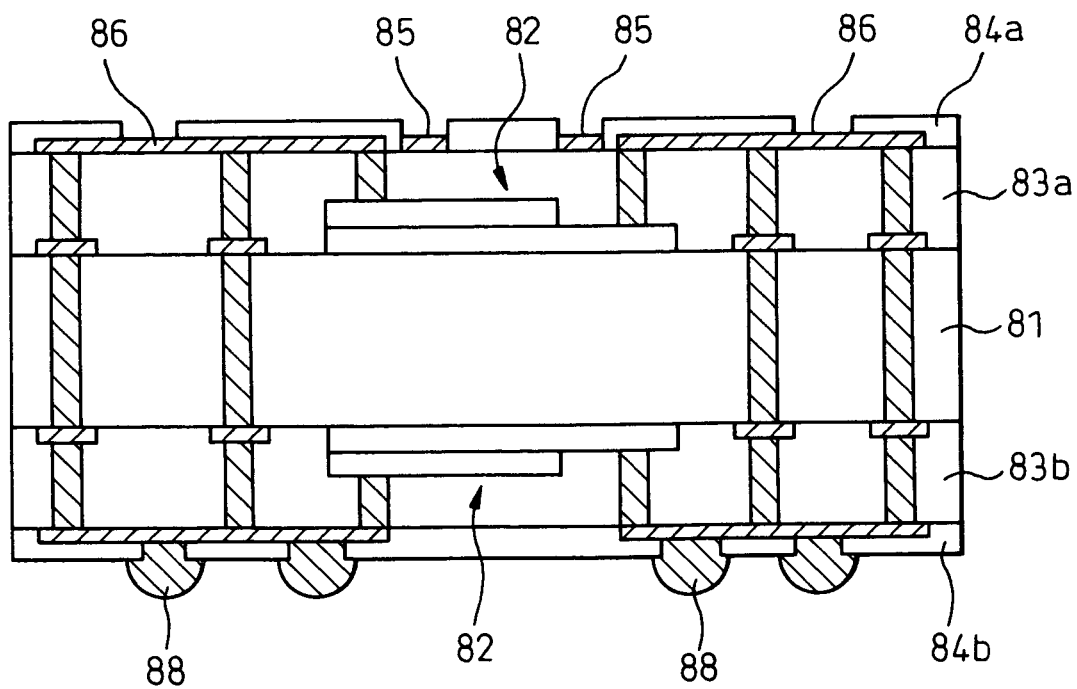
FIG. 4 is a view illustrating a further embodiment of the semiconductor chip-embedded substrate according to the present invention.

In the semiconductor chip-embedded substrate of the present invention, it is also possible in another embodiment to embed stacks of semiconductor chips on both sides of the supporting substrate. In a semiconductor chip-embedded substrate of this embodiment, as shown in FIG. 4, 81 denotes the supporting substrate, on both sides of which are stacks 82 of a plurality of chips are respectively disposed and, of the insulating layers covering the stacks, the upper insulating layer 83a has a solder resist layer 84a positioned thereon, and pads 85, used for mounting another chip, and pads 86, for the connection to an external circuit, are provided in the openings of the solder resist layer 84a. In the openings of a solder resist layer 84b on the lower insulating layer 83b, bumps 88 used for mounting the chip-embedded substrate to another substrate are provided. As an example, thickness of the supporting substrate is 200 μm and thickness of the upper and the lower insulating layers may be respectively about 100 μm.

This embodiment of the invention, in which chips are disposed on both sides of the supporting substrate, is effective in eliminating or reducing a warp produced due to differences in the materials of the constituent members. This effect is especially remarkable when the chips on both sides are disposed so as to provide a symmetrical structure, as shown.

The invention claimed is:

1. A method of manufacturing a semiconductor chip-embedded substrate which has a supporting substrate with an insulating layer thereon and a stack of electrically connected semiconductor chips mounted on the substrate and embedded in the insulating layer, and electrical connection members extending though the insulating layer, said method comprising the steps of:

forming a plurality of semiconductor chips stacked upon one another and electrically interconnected;

disposing said stack of a plurality of semiconductor chips on a surface of a supporting substrate;

forming an insulating layer over said supporting substrate so as to embed the stack of a plurality of semiconductor chips; and forming connection members for the connection to external circuits;

wherein at least one of the connection members extends through the supporting substrate and at least one of the connection members is connected to the stack of a plurality of semiconductor chips; and wherein said method also includes:

forming a second plurality of semiconductor chips stacked upon one another and electrically interconnected;

disposing said second stack of plurality of semiconductor chips on a second surface of the supporting substrate;

forming a second insulating layer over said supporting substrate second surface so as to embed the second stack of plurality of semiconductor chips; and forming second connection members for the connection to external circuits;

wherein at least one of the second connection members extends through the supporting substrate and at least one of the second connection members is connected to the second stack of plurality of semiconductor chips.

2. A method of manufacturing a semiconductor chip-embedded substrate according to claim 1, wherein said stack of a plurality of semiconductor chips is formed by electrically connecting the upper and lower semiconductor chips by wire bonding.

3. A method of manufacturing a semiconductor chip-embedded substrate according to claim 1, wherein said stack of a plurality of semiconductor chips is formed by electrically connecting the upper and lower semiconductor chips by using a through-hole provided in at least one chip.

4. A method of manufacturing a semiconductor chip-embedded substrate according to claim 1, wherein said stack of a plurality of semiconductor chips is formed by electrically connecting an upper and a lower semiconductor chips by an electro-conductive material interposed therebetween.

5. A semiconductor chip-embedded substrate assembly comprising:

a supporting substrate;

a stack of semiconductor chips stacked on one another and being electrically connected, said stack being positioned on a surface of said supporting substrate;

a dielectric layer embedding said stack and surrounding thereabout the entire surface of said supporting substrate on which said stack is positioned;

a first electrical conductor extending through said supporting substrate and through said dielectric layer; and a second electrical conductor extending from said stack through said dielectric layer;

wherein said first and second electrical conductors each have a portion exposed on the surface of said dielectric layer.

6. An assembly according to claim 5, also including a wiring layer on the surface of said dielectric layer in contact with at least one of said first and second electrical conductors.

7. An assembly according to claim 6, also including a solder resist layer over said dielectric layer and said wiring layer, said solder resist layer having openings there through and a connection pad in each said opening.

8. An assembly according to claim 7, wherein said first electrical conductor includes a through-hole connection through said supporting substrate, a pad on the surface of said supporting substrate in connection with said through-hole connection, and a post extending from said surface pad of said supporting substrate; and wherein said second electrical conductor includes a post extending from a semiconductor chip of said stack of semiconductor chips.

9. An assembly according to claim 8, also including a second wiring layer positioned on a second surface of said supporting substrate and in electrical contact with said first electrical conductor, and a second solder resist layer over said second wiring layer and said second surface of said supporting substrate, and a plurality of solder bumps being individually in contact with a wiring layer.

10. An assembly according to claim 9, also including a flip-chip type semiconductor in contact with solder bumps on said stack of semiconductor chips portion of said supporting substrate.

11. An assembly according to claim 5, also including:
- a second stack of semiconductor chips stacked on one another and being electrically connected, said second stack being positioned on a second surface of said supporting substrate;
- a second dielectric layer embedding said second stack and surrounding thereabout the entire second surface of said supporting substrate on which said second stack is positioned;
- a third electrical conductor extending in contact with said first electrical conductor and through said second dielectric layer; and
- a fourth electrical conductor extending from said second stack through said second dielectric layer.

12. A semiconductor chip-embedded substrate according to claim 5, wherein a said stack is disposed on each side of said supporting substrate.

13. A semiconductor chip-embedded substrate according to claim 5, wherein the semiconductor chips constituting said stack are electrically connected to each other by wire bonding.

14. A semiconductor chip-embedded substrate according to claim 5, wherein the semiconductor chips constituting said stack are electrically connected to each other by using through-holes provided in at least one chip.

15. A semiconductor chip-embedded substrate according to claim 5, wherein upper and lower semiconductor chips constituting a stack are electrically connected by an electro-conductive material interposed therebetween.

* * * * *